United States Patent [19]
Gardner et al.

[11] Patent Number: 5,897,358
[45] Date of Patent: Apr. 27, 1999

[54] SEMICONDUCTOR DEVICE HAVING FLUORINE-ENHANCED TRANSISTOR WITH ELEVATED ACTIVE REGIONS AND FABRICATION THEREOF

[75] Inventors: Mark I. Gardner, Cedar Creek; Mark C. Gilmer, Austin; Thomas E. Spikes, Jr., Round Rock, all of Tex.

[73] Assignee: Advanced Micro Devices, Austin, Tex.

[21] Appl. No.: 08/999,577

[22] Filed: Nov. 28, 1997

[51] Int. Cl.$^6$ .............................. H01L 21/20; H01L 21/36
[52] U.S. Cl. .............................. 438/300; 257/43; 257/49; 438/3; 438/300; 438/533
[58] Field of Search ................................ 257/43, 49, 396, 257/410, 411, 636, 638, 647; 438/3, 104, 287, 589, 620, 627, 533, 300

[56] References Cited

U.S. PATENT DOCUMENTS

| | | | |
|---|---|---|---|
| 5,352,917 | 10/1994 | Ohmi ........................................ | 257/410 |
| 5,693,979 | 12/1997 | Sato ......................................... | 257/588 |
| 5,726,087 | 3/1998 | Tseng et al. ............................. | 438/261 |
| 5,736,435 | 4/1998 | Venkatesan et al. ..................... | 438/151 |
| 5,780,343 | 7/1998 | Bashir ...................................... | 438/269 |

OTHER PUBLICATIONS

Jost, H., M. Braun and Ch. Carius, "The Role of Reactivity in Synthesis and the Properties of Magnesium Oxide" Solid State Ionics, 221–228, 1997.

Shannon, V.L. and M.Z. Karim, "Study of the Material Properties and Suitability of Plasma–Deposited Fluorine–Doped Silicon Dioxides for Low Dielectric Constant Interlevel Dielectrics", Thin Solid Films, 498–502, 1995.

Zhang Yu, and Xixin QU, "Thermal Oxidation of Thin Mangagese Films", Sensing Technology Department, Beijing Information Tech. Institute, Beijing China and Dept. of Microelectronis Tech. and Electronic Materials, Chegdu Institute of Radio Engin., Sichuan C, 1988.

*Primary Examiner*—Olik Chaudhuri
*Assistant Examiner*—Dwayne L. Bentley
*Attorney, Agent, or Firm*—Merchant, Gould, Smith, Edell, Welter & Schmidt, P.A.

[57] ABSTRACT

A semiconductor device having a fluorine-enhanced transistor with elevated active regions and process for fabricating such a device is provided. A semiconductor device, consistent with one embodiment of the invention, includes a substrate and at least one pair of elevated active regions disposed on the substrate. A fluorine-bearing barrier layer is disposed over the substrate between the elevated active regions. A high permittivity layer is disposed over the barrier layer and between the elevated active regions. Finally, a gate electrode is disposed over the high permittivity layer. In some embodiments, a thin insulating layer is disposed between the gate electrode and the high permittivity layer. The thin insulating layer and the fluorine-bearing barrier layer may, for example, both be formed of a topaz, while the high permittivity layer may, for example, be formed from a manganese oxide.

22 Claims, 5 Drawing Sheets

SEMICONDUCTOR DEVICE HAVING FLUORINE-ENHANCED TRANSISTOR WITH ELEVATED ACTIVE REGIONS AND FABRICATION THEREOF

FIELD OF THE INVENTION

The present invention generally relates to semiconductors and, more particularly, to a semiconductor device having a fluorine-enhanced transistor with elevated active regions and a process of fabricating such a device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). The source/drain regions 105 may, for example, be lightly-doped drain (LDD) source/drain regions as shown. As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

Semiconductor devices, like the one described above, are used in large numbers to construct most modern electronic devices. As a larger number of such devices are integrated into a single silicon wafer, improved performance and capabilities of electronic devices can be achieved. Device performance can be further improved by increasing the operating speeds and reliability of the transistors on a device. Accordingly, improvements to transistor structures (e.g., source and drains, gate electrodes, and gate insulating layers) are continually sought in order to increase the operating speeds and reliability of the transistors.

SUMMARY OF THE INVENTION

The present invention generally presents a semiconductor device having a fluorine-enhanced transistor with elevated active regions and a process for fabricating such a device.

A process of fabricating a semiconductor device in accordance with one embodiment of the invention is provided in which elevative active regions are formed on a substrate. A fluorine-bearing barrier layer is formed between the active regions. A relatively high permittivity layer is formed over the barrier layer and between the elevated active regions. Finally, a gate electrode is formed over the high permittivity layer. The fluorine-bearing barrier layer may, for example, be a topaz layer. In accordance with one aspect of the invention, the thin insulating layer is formed on top of the high permittivity layer prior to forming the gate electrode. In accordance with another aspect of the invention, the gate electrode is formed in a recess between the active regions.

A semiconductor device, consists with one embodiment of the invention, includes a substrate and at least one pair of elevated active regions disposed on the substrate. A fluorine-bearing barrier layer is disposed over the substrate between the active regions, and a high permittivity layer is disposed over the barrier layer and between the elevated active regions. Finally, a gate electrode is disposed over the high permittivity layer. The gate electrode may, for example, be disposed in a recess between the active regions.

In accordance with one particular embodiment, a thin top insulating layer is disposed between the high permittivity layer and the gate electrode. The barrier layer, high permittivity layer, and thin top insulating layer may form a gate insulating stack. The barrier layer and the thin top insulating layer may, for example, be formed from topaz while the high permittivity layer may, for example, be formed from a manganese oxide.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
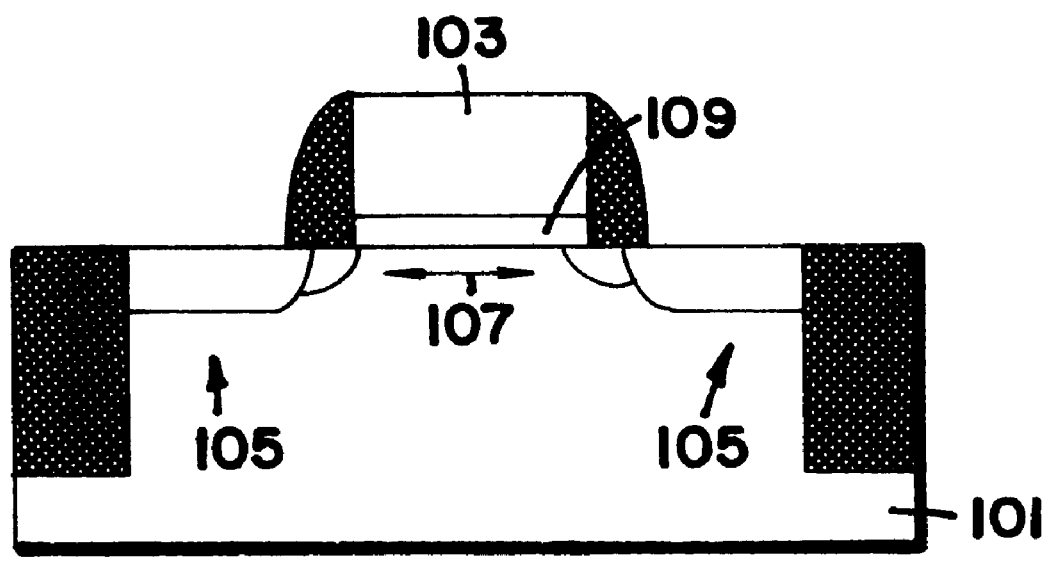
FIG. 1 illustrates a conventional MOS transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention generally relates to semiconductor devices including, for example, MOS, CMOS, and Bi-CMOS devices, having fluorine-enhanced transistors with elevated active regions. While the present invention is not so limited, details of the present invention will be illustrated through the discussion which follows.

Figure 2A:
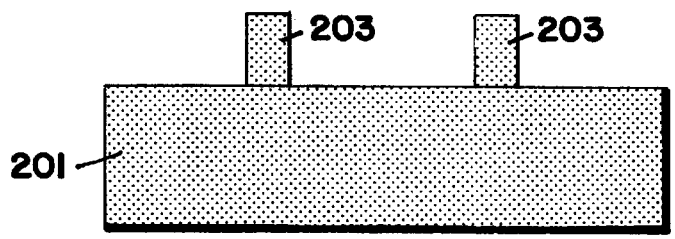
FIGS. 2A–2H illustrate an exemplary fabrication process in accordance with one embodiment of the present invention.

FIGS. 2A–2H illustrate a process for fabricating a semiconductor device having a fluorine-enhanced transistor with elevated active regions in accordance with one exemplary embodiment of the invention. In accordance with this exemplary process, elevated or raised active regions 203 are formed over a substrate 201. The resultant structure is illustrated in FIG. 2A. The elevated active regions 203 may be formed, for example, using any of a number of well-known techniques.

In accordance with one technique, the elevated active regions 203 are formed by selectively growing polysilicon over the substrate 201. The selective growth of polysilicon may be done using, for example, selective epitaxial deposition techniques. Using this technique, the elevated active regions 203 may, for example, be doped in-situ during the selective growth of polysilicon. In accordance with another technique, the elevated active regions 203 are formed by selectively removing portions of the semiconductor substrate 201 to leave elevated portions used to form the elevated active regions 203. The selective removal of the substrate 201 may be performed using, for example, well-known photolithography and etching techniques. Using this technique, the elevated active regions 203 may be doped prior to removing portions of the substrate 201.

A gate insulating layer will be formed between the elevated active regions 203. The height of the elevated active regions 203 is suitably selected in consideration of the desired height or thickness of the gate insulating layer. Suitable heights of the elevated active regions 203 range from about 0.1 to 0.25 microns for many applications. A gate electrode will be formed between the elevated active regions 203. The distance between the elevated active regions 203 is suitably selected in consideration of the desired width of the gate electrode. Suitable distances between the active regions 203 range from about 0.1 to 0.25 microns for many applications. The width of each active region 203 can vary depending on how the active region is contacted. For example, narrower active regions may be formed where subsequent contacts are formed at least in part against a side of each active region, while thicker active regions may be formed where the contacts primarily touch the top surface of each active region 203. In addition, wider active regions may be formed where an active region is shared between adjacent transistors.

Figure 2B:
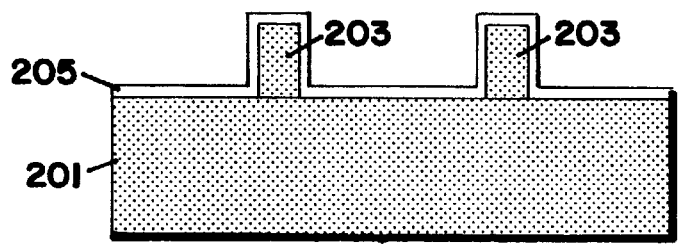

A thin barrier layer 205 is formed over the substrate 201 and the elevated active regions 203. The resultant structure is illustrated in FIG. 2B. The thin barrier layer 205 is generally used to separate a high permittivity material from the substrate 201. The barrier layer 205 may, for example, be formed from a fluorine-bearing species (e.g., a material which contains fluorine atoms). The incorporation of fluorine (Fl) within the barrier layer 205 advantageously increases the resultant transistor's resistance to hot carrier injection effects (such as the injection of electrons from the drain into the gate electrode). The thickness of the barrier layer 205 is typically minimized while providing adequate resistance to hot carrier injection.

In the example embodiment, the barrier layer 205 is formed from topaz ($AlF_2SiO_4$). The topaz may be formed using a number of different deposition techniques, including, for example, metal-organic chemical vapor depostion (MOCVD), plasma vapor depostion (PVD), and RF sputtering techniques. Suitable thicknesses for a topaz barrier layer 205 range from about 5 to 10 Å for many applications. The topaz has a dielectric constant (i.e., permittivity) of about 8 which advantageously is higher than the dielectric constant of silicon dioxide (e.g., about 4) which is usually used as the gate insulator in conventional transistors. Accordingly, 5 to 10 Å of topaz has the equivalent silicon dioxide thickness of 2.5 to 5 Å of silicon dioxide.

After forming the fluorine-bearing barrier layer 205 (such as a topaz barrier layer), the substrate 201 may be heated in order to activate the fluorine. In the example embodiment, the topaz barrier layer 205 is annealed at 900° to activate the fluorine within the topaz. The anneal may, for example, advantageously be performed in-situ (i.e., in the same reaction chamber) with deposition of the topaz barrier layer. Prior to forming the barrier layer 205, the substrate 201 (and elevated active regions 203) may be cleaned to remove any residual or native oxide. In the example embodiment, the substrate 201 and active regions 203 are cleaned by flowing $NF_3$ gas over the substrate at about 500° C. This cleaning process may also be performed in-situ with the formation of the barrier layer 205.

Figure 2C:
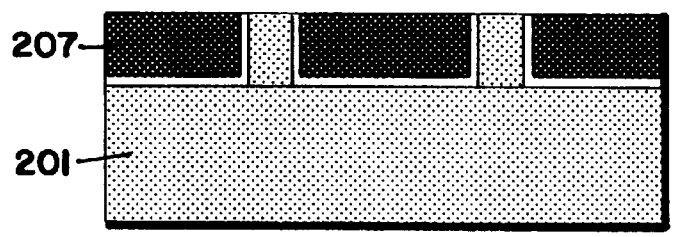

A layer of high permittivity material 207 is formed over the barrier layer 205, as illustrated in FIG. 2C. The high permittivity layer 207 may, for example, be formed using well-known deposition techniques. In the example embodiment, the high permittivity layer 207 is deposited over the substrate 201 and planarized such that the upper surface of the high permittivity layer 207 lies substantially in the same plane as the upper surface of the elevated active regions 203. Accordingly the resultant thickness of the high permittivity layer is about equivalent to the height of the active regions 203 less the thickness of the barrier layer. As the barrier layer thickness is relatively small, the thickness of the high permittivity lay may be approximated to the height of the active regions 203 (e.g., about 0.1 to 2.5 microns or 100 to 2500 Å). During the planarization, portions of the barrier layer 205 over the active regions 203 may be removed. The planarization of the high permittivity layer 207 (and barrier layer 205) may be done using, for example, well-known polishing techniques.

The high permittivity layer 207 may be formed from a number of different dielectric materials which have a higher dielectric constant than the dielectric constant of silicon dioxide (e.g., about 4). Typically, the dielectric constant of the high permittivity layer is greater than 20. Suitable high permittivity materials include, for example, barium strontium titanate $Ba_{1-x}Sr_xO_3$ (BST) tantalum oxide $Ta_xO_y$, lead zirconate titanate (PZT), or lead lanthanum zirconate titanate (PLZT). In the exemplary embodiment, the high permittivity layer 207 is formed from a manganese oxide (e.g., $MnO_2$). A manganese oxide high permittivity layer 207 may be formed using a number of different well-known deposition techniques. The dielectric constant of manganese oxide is about 10,000. Accordingly, 100 to 2500 Å of manganese oxide has the equivalent thickness as 0.04 to 1 Å of silicon dioxide.

A thin dielectric layer 209 is formed over the substrate 201 in order to encapsulate the high permittivity layer 207.

Figure 2D:
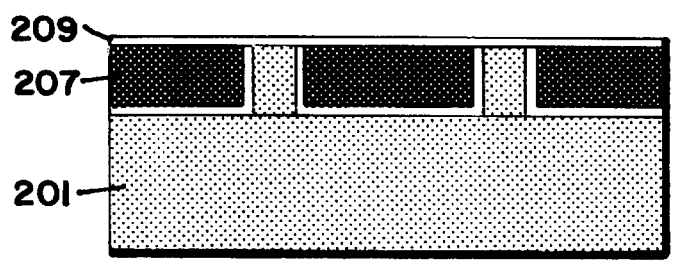

The resultant structure is illustrated in FIG. 2D. A gate electrode will be formed over the thin dielectric layer 209. The thin dielectric layer 209 is used to insulate the gate electrode from the elevated active regions 203 and, in some instances, from the high permittivity layer 207 where the high permittivity layer 207 is caustic to the gate electrode material. In the example embodiment, the thin dielectric layer 209 is formed from topaz. This second layer of topaz may be formed using, for example, well-known deposition techniques. Suitable thicknesses of a topaz dielectric layer 209 range from about 5 to 10 Å for many applications. Accordingly, the topaz dielectric layer has a thickness equivalent to about 2.5 to 5 Å of silicon dioxide. The barrier layer 205, high permittivity layer 207, and thin dielectric layer 209 collectively form a gate insulating layer which is used to insulate the gate electrode from the substrate 201.

Figure 2E:
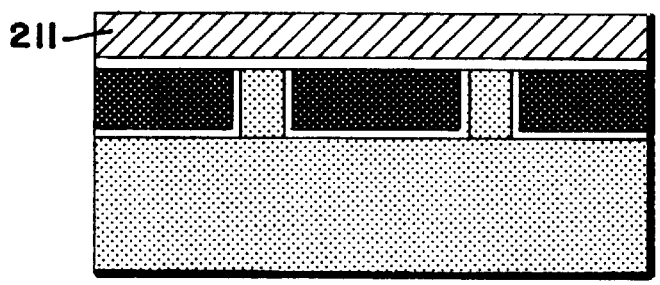

A gate electrode 215 (shown in FIG. 2F) is formed over the thin dielectric layer 209. In the example embodiment, the gate electrode 215 is formed by forming a layer of conductive material 211 over the substrate 201. The resultant structure is illustrated in FIG. 2E. The conductive material layer 211 may, for example, be formed from doped polysilicon or a metal, such as iridium, copper, or tungsten. The conductive layer 211 may be formed using, for example, well-known deposition (and in the case of polysilicon, doping) techniques. The thickness of the conductive material layer 211 is suitably selected in consideration of the desired thickness of the gate electrode 215. Suitable thicknesses range from about 1000 to 2000 Å for many applications.

Figure 2F:
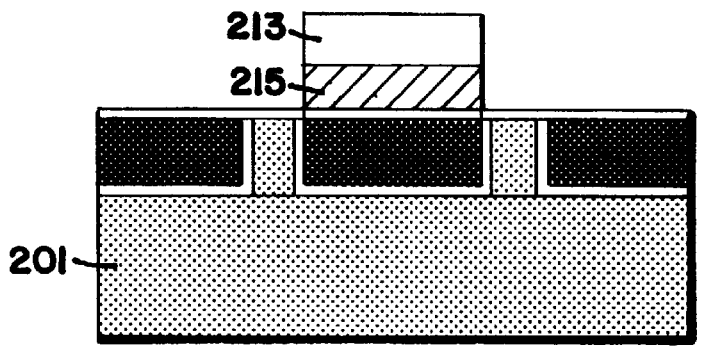
Figure 2G:
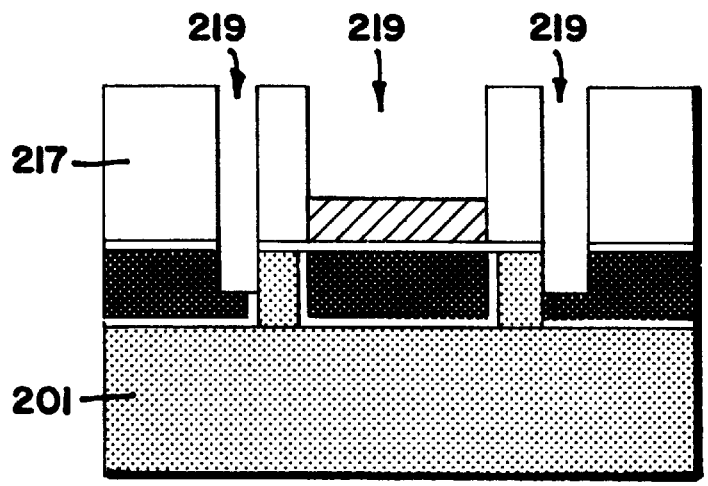

A masking layer 213 is formed over the substrate 201 and portions of the masking layer 213 are selectively removed to expose portions of the underlying conductive layer 211. The exposed portions of the conductive layer 211 are then removed to form the gate electrode 215, as illustrated in FIG. 2F. The masking layer 213 may be formed using, for example, well-known photolithography techniques. Removal of the portions of the conductive layer 211 may be performed using, for example, well-known etching techniques.

The masking layer 213 is removed and a dielectric layer 217 is formed over the substrate 201. A patterned mask is formed over the dielectric layer 217 and exposed regions of the dielectric layer 217 are removed to form contact openings 219. The contact openings 219 will be used to connect the elevated active regions 203 and the gate electrode 215 with conductive lines (e.g., metal lines). The patterned masking layer is then removed. The resultant structure is illustrated in FIG. 3G. It is noted that the contact openings 219 which expose the active regions 203 are shown alongside the elevated active regions 203. In alternate embodiments, the contact openings 219 for the elevated active regions 203 may contact only the top surface of the elevated active regions 203 or the top surface as well as the side surface of the elevated active regions 203.

Figure 2H:
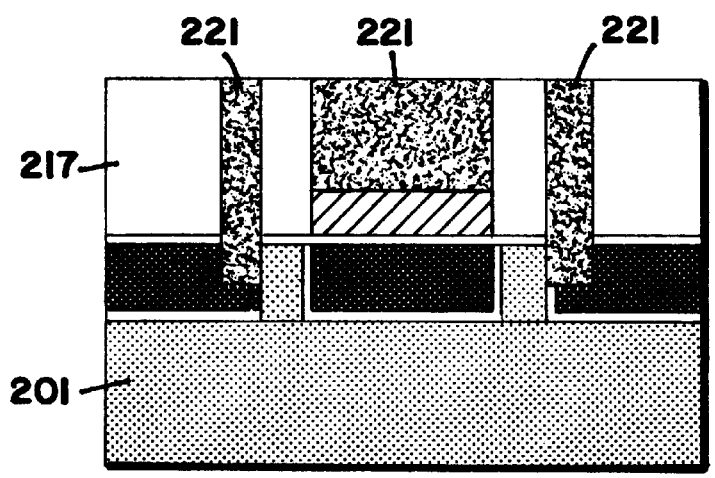

The contact openings 219 are then filled with a conductive material to form conductive contacts 221. The resultant structure is illustrated in FIG. 2H. The contacts 221 may, for example, formed by depositing a layer of metal over the substrate 201 and polishing the metal to a level surface with the dielectric layer 217. Metal deposition and polishing may be done using well-known techniques. The resultant structure illustrated in FIG. 2H generally includes a fluorine-enhanced gate insulating layer stack formed between elevated active regions and a gate electrode formed over the gate insulating layer stack. In the example embodiment, the gate insulating layer stack is a topaz-manganese oxide-topaz stack. Where the gate insulating layer stack is formed from about 5 to 10 Å of a topaz barrier layer, 100 to 2500 Å of manganese oxide high permittivity layer, and 5 to 10 Å of a topaz capping layer, the equivalent silicon dioxide thickness of the gate insulating layer stack is about 5 to 11 Å.

Using the above process, a fluorine-enhanced transistor having elevated active regions may be formed. In particular, a transistor having a topaz-manganese oxide-topaz gate insulating layer stack may be formed using elevated active regions. The gate insulating stack may increase device performance by, for example, increasing the reliability of the transistor and reducing the effective gate thickness between the gate electrode and the substrate.

Figure 3A:
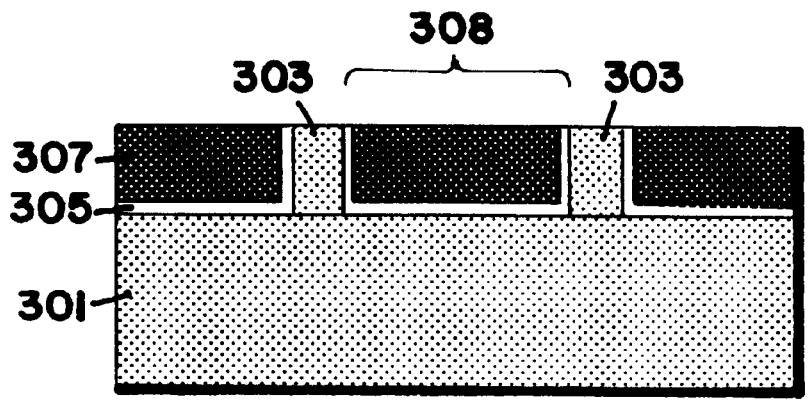
FIGS. 3A–3C illustrate an exemplary fabrication process in accordance with another embodiment of the invention.
Figure 3B:
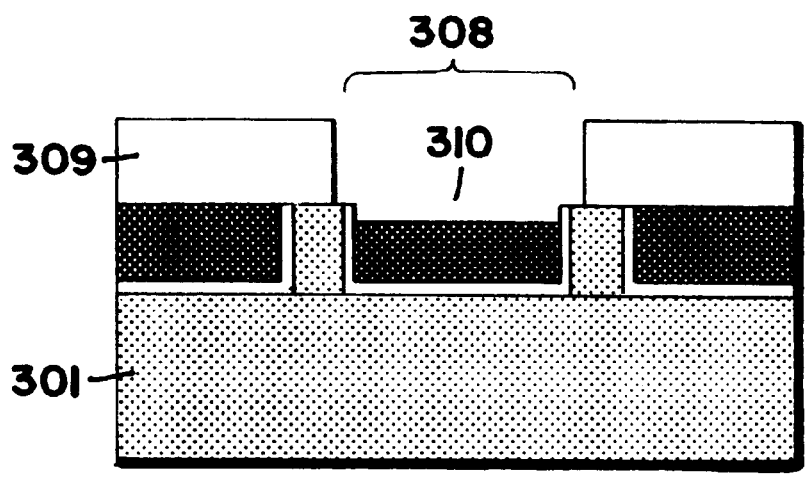
Figure 3C:
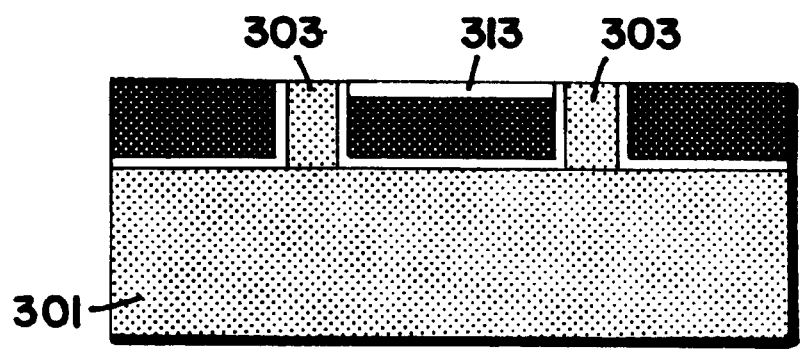

FIGS. 3A–3C illustrate an exemplary process for fabricating a semiconductor device having a fluorine-enhanced transistor with a polished gate electrode between elevated active regions. In accordance with this exemplary process, elevated active regions 303 are formed over a substrate 301. A thin barrier layer 305 is formed over the substrate 301 and the active regions 303. A high permittivity material 307 is then formed over the barrier layer 305. A region 308 between the active regions 303 will be used as a gate insulating layer. The resultant structure, illustrated in FIG. 3A, may be formed in a similar manner as discussed above with respect to FIGS. 2A–2C.

A portion of the high permittivity material in region 308 is removed to form a recess 310 between the active regions 303. The recess 310 may be formed by, for example, forming a mask 309 over the substrate 310 to selectively expose the high permittivity material in region 308 between the active regions 303, and removing a portion of the high permittivity material in region 308 to form the recess 310. The mask 309 may, for example, be formed using well-known photolithography techniques. The removal of the portion of the high permittivity material in region 308 may be performed using, for example, well-known etching techniques. In this exemplary process, the etchants used in the etching process are selective to polysilicon and the barrier layer 305. This leaves the barrier layer 305 defining the sidewalls of the recess 310. Optionally, spacers (e.g., nitride spacers) may be formed on sidewalls the recess 310 to further increase the thickness of the sidewalls of the recess 310. Suitable recess depths range from about ⅓ to ½ of the active region height for many applications.

The mask 309 is removed and a gate electrode 313 is formed in the recess 310, as illustrated in FIG. 3C. The gate electrode 313 may be formed, for example, by depositing a layer of conductive material over the substrate 301 and polishing the conductive material to form the gate electrode 313 such that the upper surface of the gate electrode 313 lies at or below the upper surface of the active regions 303. The barrier layer 305 insulates the gate electrode 313 from the active regions 303. The gate electrode may, for example, be formed from doped polysilicon or a metal, such as iridium, tungsten, or copper, for example. Fabrication may continue with well-known fabrication steps, such as interconnect formation and so forth, to form the ultimate device structure.

Figure 4A:
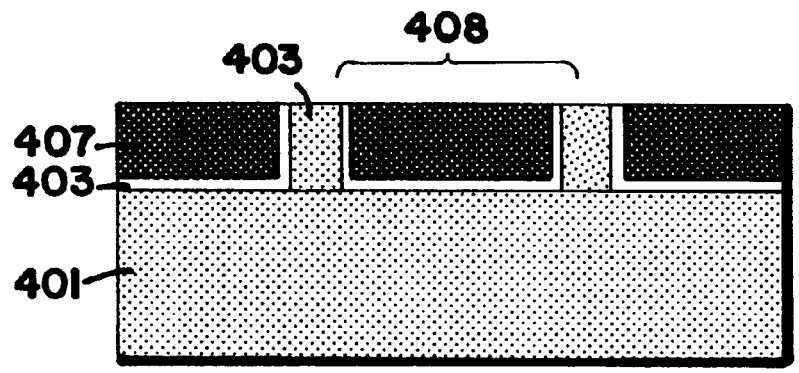
FIGS. 4A–4C illustrate an exemplary fabrication process in accordance with yet another embodiment of the invention.
Figure 4B:
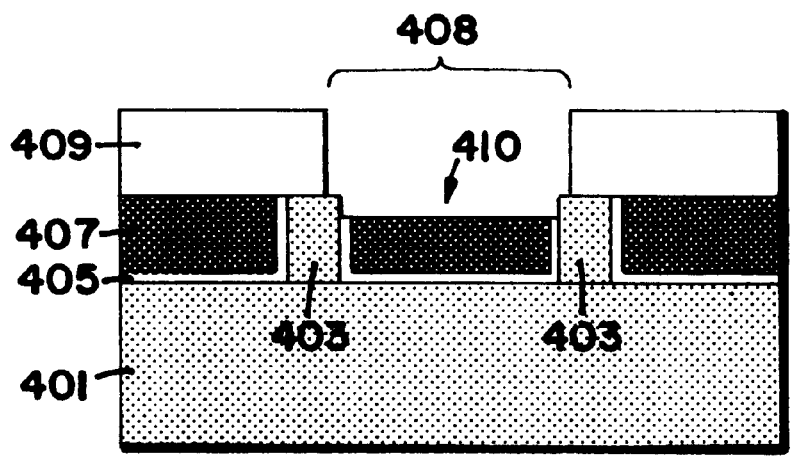
Figure 4C:
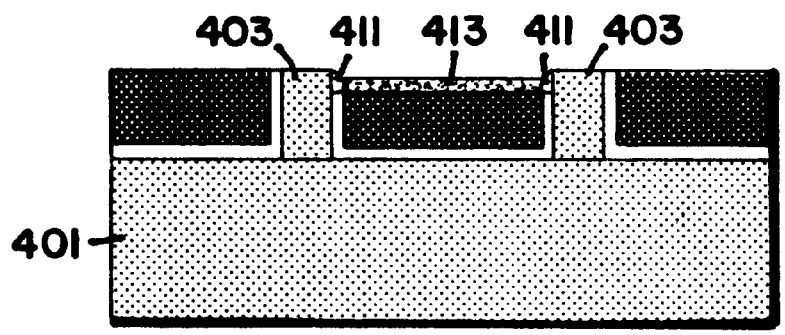

FIGS. 4A–4C illustrate another exemplary process for fabricating a semiconductor device having a fluorine-enhanced transistor with a polished gate electrode between elevated active regions. In accordance with this exemplary process, elevated active regions 403 are formed over a substrate 401. A thin barrier layer 405 is formed over the substrate 401 and the active regions 403. A high permittivity material 407 is then formed over the barrier layer 405. A region 408 of between the active regions 403 will be used as a gate insulating layer. The resultant structure illustrated in FIG. 4A may be formed in a similar manner as discussed above with respect to FIGS. 2A–2C.

A portion of the high permittivity material/barrier layer in region 408 is removed to form a recess 410 between the active regions 403. The recess 410 may be formed by, for example, forming a mask 409 over the substrate 410 to selectively expose the region 408 between the active regions 403, and removing a portion of the high permittivity material and barrier layer in region 408 to form the recess 410. The mask 409 may, for example, be formed using well-known photolithography techniques. The removal of the portion of the high permittivity material/barrier layer may be performed using, for example, well-known etching techniques. In this exemplary process, the etchants used in the etching process are selective only to polysilicon. A portion of the barrier layer 405 as well as a portion of the high permittivity layer 407 within the region 408 are removed, leaving the active regions 403 defining the sidewalls of the recess 410. Suitable recess depths range from about ½ to ⅓ the thickness of the elevated active regions 403.

The mask 409 is removed and spacers 411 are formed on sidewalls of the active regions 403 within the recess 410. The spacers 411 are used to insulate the active regions 403 from a gate electrode which will be formed in the recess 410. The spacers 411 are formed of a dielectric material, such as an oxide or a nitride, using, for example, well-known techniques. The thickness of the spacers 411 is suitably selected in consideration of the desired separation between the gate electrode and the active regions 403. Suitable spacer thicknesses range from about 50 to 100 Å for many applications.

A gate electrode 413 is formed in the recess 410 between the spacers 411, as illustrated in FIG. 4C. The gate electrode 414 may be formed, for example, by depositing a layer of conductive material over the substrate 401 and polishing the conductive material to form the gate electrode 413 such that the upper surface of the gate electrode 413 lies at or below the upper surface of the active regions 403. The spacers 411 insulate the gate electrode 413 from the active regions 403. The gate electrode may, for example, be formed from doped polysilicon or a metal, such as iridium, tungsten, or copper, for example. Fabrication may continue with well-known fabrication steps, such as interconnect formation and so forth, to form the ultimate device structure.

Using the above process, a fluorine-enhanced transistor having a polished gate electrode between elevated active regions may be formed. The polished gate electrode provides a relatively planar surface after gate electrode formation and facilitates subsequent fabrication steps.

As noted above, the present invention is applicable to the fabrication of a number of different devices having fluorine enhanced transistors. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A process of fabricating a semiconductor device, comprising:
    forming elevated active regions on a substrate;
    forming a fluorine-bearing barrier layer between the active regions;
    forming a high permittivity layer relative to silicon dioxide over the barrier layer and between the elevated active regions; and
    forming a gate electrode over the high permittivity layer.

2. The process of claim 1, wherein forming the elevated active regions includes depositing polysilicon on the substrate.

3. The process of claim 2, wherein the polysilicon is deposited using selective epitaxial growth.

4. The process of claim 1, wherein forming the elevated active regions includes selectively removing portions of the substrate adjacent the active regions.

5. The process of claim 4, wherein the fluorine-bearing barrier layer is formed from a fluorine-bearing species.

6. The process of claim 5, wherein the fluorine-bearing species is topaz.

7. The process of claim 1, further including forming a second thin insulating layer on top of the high permittivity layer prior to forming the gate electrode.

8. The process of claim 7, wherein the second thin insulating layer is formed from a fluorine-bearing species.

9. The process of claim 8, wherein the fluorine-bearing species is topaz.

10. The process of claim 1, wherein the barrier layer is formed on sidewalls of the elevated active regions.

11. The process of claim 1, wherein forming the gate electrode includes:
    depositing a gate electrode layer over the gate insulator; and
    selectively removing portions of the gate electrode layer.

12. The process of claim 1, further including recessing the high permittivity layer with respect to a top surface of the active regions to form a recess, wherein the gate electrode is at least partially formed in the recess.

13. The process of claim 1, further including recessing the high permittivity layer and the barrier layer with respect to a top surface of the active regions to form a recess, wherein the gate electrode is least partially formed in the recess.

14. The process of claim 13, further including forming spacers on sidewalls of the recess prior to forming the gate electrode.

15. A process of fabricating a semiconductor device, comprising:
    forming elevated active regions on a substrate;
    forming a topaz barrier layer over the substrate between the active regions and on sidewalls of the active regions;
    forming a manganese oxide layer over the topaz barrier layer and between the elevated active regions; and
    forming a gate electrode over the manganese oxide layer.

16. The process of claim 15, further including selectively removing a portion of the manganese oxide layer to form a recess between an upper surface of the manganese oxide layer and an upper portion of the active regions, wherein the gate electrode is formed in the recess.

17. The process of claim 15, further including forming a second topaz layer on top of the manganese layer prior to forming the gate electrode.

18. A semiconductor device, comprising:
    a substrate;
    at least one pair of elevated active regions disposed on the substrate;
    a fluorine-bearing barrier layer disposed over the substrate between the active regions;
    a high permittivity layer relative to silicon dioxide disposed over the barrier layer and between the elevated active regions; and
    a gate electrode disposed over the high permittivity layer.

19. The semiconductor device of claim 18, wherein the gate electrode is disposed in a recess between the active regions.

20. The semiconductor device of claim 18, further including spacers disposed sidewalls of the recess between the active regions and the gate electrode.

21. The semiconductor device of claim 18, further including a thin top insulating layer disposed between the high permittivity layer and the gate electrode.

22. The semiconductor device of claim 21, wherein the barrier layer and thin top insulating layer are formed of topaz and the high permittivity layer is formed of a manganese oxide.

* * * * *